(12) United States Patent
Boussuge et al.

(10) Patent No.: US 10,354,020 B2
(45) Date of Patent: Jul. 16, 2019

(54) COMPUTER-ASSISTED DESIGN METHOD COMPRISING A MODELLING STEP

(71) Applicants: AIRBUS GROUP SAS, Paris (FR); INSTITUT POLYTECHNIQUE DE GRENOBLE, Grenoble (FR)

(72) Inventors: Flavien Boussuge, Suresnes (FR); Lionel Fine, Velizy-Villacoublay (FR); Jean-Claude Leon, Gieres (FR); Stefanie Hahmann, Meylan (FR)

(73) Assignees: AIRBUS, Blagnac (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 319 days.

(21) Appl. No.: 15/021,243

(22) PCT Filed: Sep. 9, 2014

(86) PCT No.: PCT/EP2014/069161
§ 371 (c)(1),
(2) Date: Mar. 10, 2016

(87) PCT Pub. No.: WO2015/036390
PCT Pub. Date: Mar. 19, 2015

(65) Prior Publication Data
US 2016/0224694 A1    Aug. 4, 2016

(30) Foreign Application Priority Data
Sep. 13, 2013    (FR) ..................... 13 58842

(51) Int. Cl.
*G06F 17/50* (2006.01)
*G06T 17/10* (2006.01)

(52) U.S. Cl.
CPC .............. *G06F 17/50* (2013.01); *G06T 17/10* (2013.01)

(58) Field of Classification Search
USPC .............. 703/1, 22, 2; 715/700, 746; 75/750
See application file for complete search history.

(56) References Cited

U.S. PATENT DOCUMENTS 5,377,129 A * 12/1994 Molvig ................. G06F 15/803
702/50
5,959,624 A * 9/1999 Johnston, Jr. ......... G06F 9/4443
715/746

(Continued)

OTHER PUBLICATIONS

Sakurai, "Volume decomposition and feature recognition: Part I—Polyhedral objects," Computer Aided Design, Nov. 1, 1995, pp. 833-843, vol. 27, No. 11, Elsevier Publishers BV, Barking, GB.

(Continued)

*Primary Examiner* — Thai Q Phan
(74) *Attorney, Agent, or Firm* — Im IP Law; C. Andrew Im; Chai Im

(57) ABSTRACT

A computer-assisted design method for a second three-dimensional object from a first three dimensional object known only by its boundary surfaces, through a surface model of the B-Rep type, of the planar, cylindrical, cone, sphere, or toroid type, excluding free forms in defining the boundary of the object. The first object is broken down into a set of simple volume primitives. The first object is associated with a construction graph defined from these volume primitives and a set of geometric parameters for using these volume primitives in the specific case of that first object. The construction graph enables a compact description of all of the construction alternatives of the object through Boolean combinations of these primitives. The second object is generated as an alternative of the first object according to that construction graph, by modifying some of these parameters.

9 Claims, 5 Drawing Sheets

(56) References Cited

U.S. PATENT DOCUMENTS

| | | | | |
|---|---|---|---|---|
| 6,104,391 | A * | 8/2000 | Johnston, Jr. | G06F 9/4443 715/745 |
| 2002/0085019 | A1 * | 7/2002 | Ruff | G06F 9/4443 715/700 |
| 2003/0052921 | A1 * | 3/2003 | Ulrich | G06F 9/4443 715/765 |
| 2010/0011306 | A1 * | 1/2010 | Ruff | G06F 9/4443 715/763 |

OTHER PUBLICATIONS

Woo et al., "Recognition of maximal features by volume decomposition," Computer Aided Design, Mar. 1, 2002, pp. 195-207, vol. 34, No. 3, Elsevier Publishers BV, Barking, GB.

Sakurai et al., "Volume decomposition and feature recognition: Part II : Curved objects," Computer Aided Design, Jun. 7, 1996, pp. 519-537, vol. 28, No. 6, Elsevier Publishers BV, Barking, GB.

* cited by examiner

Phase 1: Morphological analysis of primitives Pi

- Overall morphological analysis of each primitive Pi relative to its extrusion distance
- Morphological analysis of sketch contour and determination of idealization subdomains $Dj_{(Pi)}$ of each primitive

Phase 2: Extension of subdomains Dj(Pi) in object

- Analysis and categorization of interfaces IG between subdomains $Dj_{(Pi)}$
- Segmentation of subdomains $Dj_{(Pi)}$ as a function of IG interfaces in new subdomains $D'k_{(Pi)}$
- Creation and updating of new interfaces IG' between subdomains $D'k_{(Pi)}$

Phase 3: Idealization of subdomains $D'k_{(Pi)}$ and processing of connections

- Generation of mean surfaces and median lines of idealization subdomains $D'k_{(Pi)}$
- Generation of surfaces and connection lines between idealized subdomains $D'k_{(Pi)}$ as a function of interfaces IG'
- Exporting of idealized model $M_i$

Fig.4

COMPUTER-ASSISTED DESIGN METHOD COMPRISING A MODELLING STEP

RELATED APPLICATIONS

This application is a § 371 application from PCT/EP2014/069161 filed Sep. 9, 2014, which claims priority from French Patent Application No. 13 58842 filed Sep. 13, 2013, each of which is herein incorporated by reference in its entirety.

FIELD OF THE INVENTION

The present invention belongs to the field of methods of designing three-dimensional objects using a computer.

It is directed in particular at a method of designing a three-dimensional object having volume and an association of that object with a construction graph based on simple shape primitives making it possible to describe in a compact manner all the construction variants of that same object. The automatic generation of the construction graph relies on a phase of decomposition of this initial 3D object, known only through a surface model of its boundary, into a set of simple volume primitives.

BACKGROUND OF THE INVENTION

During the design of a complete system, for example an aircraft, there may appear, for example by virtue of modifications of the specifications of the complete system, a requirement to modify geometrical characteristics of a known object, the geometric and mechanical characteristics of which are known.

Such dimensional modification of a known three-dimensional part notably involves calculations of mechanical resistance to certain dimensioning forces. These calculations, most often using finite element type numerical methods, involve modeling the part addressing the stated objectives of the calculations and modifications of shape. This modeling includes a so-called idealization phase, in which an operator proceeds to simplify the part to highlight the elements of its structure, notably its stiffeners, thin walls, etc., that can be modeled by plates, shells, etc. and thereby address the corresponding calculation objectives. Idealization therefore refers to geometrical transformations in which a subset of a volume may be transformed into a surface or a line respectively representative of a plate or a shell or indeed a beam in the case where the geometrical element is a line. This idealization phase produces a so-called idealized model of the initial object. This idealized model could be processed using a finite element type approach. The results of these calculations could lead to modifications to the dimensions of the initial object in order to respond to the modifications of the specification.

At present, the idealization transformations are essentially done manually. Access to parameterization and to decomposition of an object suited to the requirement of a discipline is, at best, linked to the construction tree of that object, as it exists in the CAD (computer-assisted design) environment or more generally in geometrical modeling software capable of associating a construction tree with the geometrical model of an object.

Very often there is no simple way to satisfy the shape modification requirements because:

the construction tree is lost if the geometrical model of the object has to be transferred between the software in which it was created and some other software meeting the requirement of some other discipline, the 3D object is described only by a single construction tree generated by the user during the construction of the object.

There are employed in the remainder of the description numerous terms borrowed from mathematical graph theory, from topology: graph, tree, CW complex, etc. These terms are employed with their standard meaning in that theory.

In CAD, a construction tree is defined as an ordered sequence of shape generation processes (also referred to as generative processes corresponding to the creation of primitives) usually created by a CAD modeler when designing an object by so-called B-Rep (Boundary Representation: surface modeling of a volume by its boundary: faces, edges and vertices).

However, in numerous configurations such a construction tree does not provide all the required properties: modifications of dimensions, idealization process for finite element analysis, etc. This remark naturally applies in all cases where the 3D object is not associated with a construction tree, which is a frequent situation in the case of designing complete systems.

The best known CAD (computer-assisted design) and simulation software offer idealization functions that are not highly automated and not very robust. They also offer decomposition into shape features and into primitives (basic cylinder, cone, cube, etc. shapes) that are limited to a single construction tree and are not very well suited to idealization because the primitives that they contain are often not suitable for idealization processes. Moreover, CAD software associates objects with trees that are necessarily binary, i.e. a single primitive is added to the shape of the intermediate object in each construction step, i.e. at each node of the construction tree.

SUMMARY OF THE INVENTION

The invention is therefore directed to a method for the computer-assisted design of a second three-dimensional object on the basis of a first three-dimensional object known only by its boundary surfaces (via a B-Rep type volume model) of plane, cylinder, cone, sphere, toroid type, to the exclusion of free shapes in the definition of the boundary of the object, the method including steps of:

dividing the first object into a set of simple volume primitives, associating with this first object a construction graph defined on the basis of these volume primitives and a set of geometrical parameters of use of these volume primitives in the specific case of this first object, creating the second object as a variant of the first object in accordance with this construction graph by modifying some of these parameters (for example diameter, length, etc.).

Remember at this point that a tree is a special case of a graph including no cycles.

A construction graph may include cycles, notably, in the case of the present method, when two different sequences generating the same object are obtained by a first series of identical and identically ordered primitives for each of the two sequences, and then diverge in terms of the shape of the primitives contained in each sequence, and thereafter lead again to the same intermediate shape, which is reflected in the graph by two branches terminated by the same two nodes of said graph. Each node of a sequence represents an intermediate shape evolving progressively from "root"

primitives toward the same complete object. Each of these sequences represents a tree that is a construction tree of the object extracted from the construction graph.

In one particular embodiment of the method, said construction graph includes all the construction variants of the object through Boolean combinations of these primitives.

In other words, the method includes a step of modeling the first three dimensional object in construction graph shape using a predetermined set of volume primitives and Boolean operations determining the combination of these volume primitives in said object.

The decomposition method used in the present method makes it possible to impart a structure to an object (decomposition graph) in order to allow simple and rapid modifications of the shape of that object.

The method proposes to extract a construction graph from a (B-Rep) volume model of an object, said volume model being conventionally obtained using CAD software, so that the generative processes (primitives and associated Boolean operations), identified in the construction graph, are usable for finite element analyses and, in this case in particular, for idealization. However, the method is not restricted to the case of finite element analyses and may be used for any operation necessitating a modification of the parameters or the shape of said volume model.

In one particular embodiment of the method, the decomposition graph produced by the method includes at each node the greatest number of possible primitives that may be applied at each step of construction of the object, which makes possible compact encoding of a large number of construction possibilities of that object, in contrast to the construction trees of CAD software that generates binary construction trees. Similarly, primitive generation variants are not distinguished in the construction graph. For example, the variants of generation by extrusion of a rectangular parallelepiped in three different directions are not distinguished. More generally, the construction graph includes a set of nodes representing a minimum, non-trivial set of shapes of the object at different intermediate steps of its construction.

In one particular embodiment of the method, the non-trivial steps of construction of the object characterized by a node of the construction graph may be associated with simple algorithms making it possible to enumerate the complementary variants not explicitly stated. For example, a node including a plurality of primitives may be associated with an algorithm expressing all the binary tree variants making it possible to generate each of the construction trees as produced by CAD software.

In one particular embodiment of the method, the construction graph is extracted with the aid of a primitive suppression operator that progressively simplifies the shape of the object. The principle is, as it were, to "work back in time" starting from the initial complete object and progressively eliminating shape primitives of that object until reaching at least one "root" primitive. The standard process of geometric construction of an object based on primitives may be seen as a temporal process in which the user starts from simple primitives and progressively combines them with others to complicate the intermediate shape of the object until the required final shape is obtained.

In one particular embodiment of the method, the primitives used comprise extrusion primitives defined by two parallel faces including an extrusion contour and an extrusion direction that is not parallel to those faces. In this way, the method is capable of efficiently processing mechanical type components, which adapt particularly well to modeling by extrusion primitives.

In one particular instance, the extrusion primitives are associated with each node of the construction graph with a Boolean union operator, which corresponds to an operation of addition of material.

In one particular embodiment of the method, the primitives used comprise revolution primitives.

The various different reference primitives considered here are generated on the basis of a sketching step in a plane defining at least one closed contour, the contour being composed of straight line segments and circular arcs.

In one particular embodiment of the method, the latter includes a step of removing connecting radii of the initial object, notably for variable radius roundings. To be more precise, the connecting radii removed are those that cannot be integrated into the contours of extrusion or revolution primitives.

In one particular embodiment of the method, the boundary of the initial object is transformed, without changing the shape of the object, into a set of maximum edges and faces. This new representation is unique and intrinsic to the shape of the object.

In one particular embodiment of the method, the latter includes a step of identifying maximum primitives in each step of division of the object, a primitive identified at a step of the process of constructing an object being referred to as a maximum primitive if no other primitive valid in the same step can be entirely inserted into the primitive.

The maximum primitives are identified on the basis of the maximum edges and faces defining the boundary of the intermediate object available at each step of the composition of the initial object.

In one particular embodiment of the method, the generative processes used are additive, that is to say that they are exclusively founded on a union operator regularized during the combination of primitives in each modeling step t of the generative processes.

This is particularly advantageous when the intention is to generate a set of generative processes that best correspond to the idealization requirements. In actual fact, the objects subjected to idealization transformations, such as the determination of mean surfaces, are characterized by surfaces or lines situated inside these primitives, and the connections between the primitives also locate the connections between their idealized representatives (said surfaces and lines, see above) when these connections derive from the objectives formulated for a finite element model.

Therefore, the idealized representation of the object M, corresponding to the final object of the construction graph, may be derived from the idealized representation of each maximum primitive $P_i$ present in the construction graph of M and its connections, independently of the other maximum primitives present in the same graph. This applies when the primitives $P_i$ are combined with one another only by a regularized Boolean union operation.

In the case where the nodes of the construction graph included material removal operations, that is to say regularized Boolean difference operations, the idealization transformations are more complicated to deal with, while the resulting volume shapes are identical, which in this case is of no benefit in terms of regularized Boolean difference operations. However, if the object M cannot be broken down into a set of primitives $P_i$ combined by regularized Boolean union operations, the graph generation process is applicable but will produce root primitives that will not be extrusion or revolution primitives.

The idealization of the object M on the basis of its primitives confers more robustness on that process compared to the prior art for two reasons: firstly, each maximum primitive Pi and its connections determine as much the 3D location of the idealized representation of Pi as its connections with other neighboring idealized primitives, that is to say primitives whose Boolean intersection with Pi is non-zero. Secondly, a classification of the connection categories may be defined, which is important because the idealization processes still rely on the know-how of the user to process connections significantly different from the simple connections that CAD software or finite element calculation software currently process.

In one particular embodiment of the method, the initial objects M broken down into primitives are associated with a construction graph including only generative processes that add material. That is to say, each node of the construction graph associated with M includes only regularized Boolean union operations.

DESCRIPTION OF THE FIGURES

The characteristics and advantages of the invention will be better appreciated thanks to the following description, which explains the features of the invention through a nonlimiting example of applications.

The description refers to the appended figures, which show:

FIG. 4: a general flowchart of the various steps of an idealization method.

DETAILED DESCRIPTION OF ONE EMBODIMENT OF THE INVENTION

Figure 1:
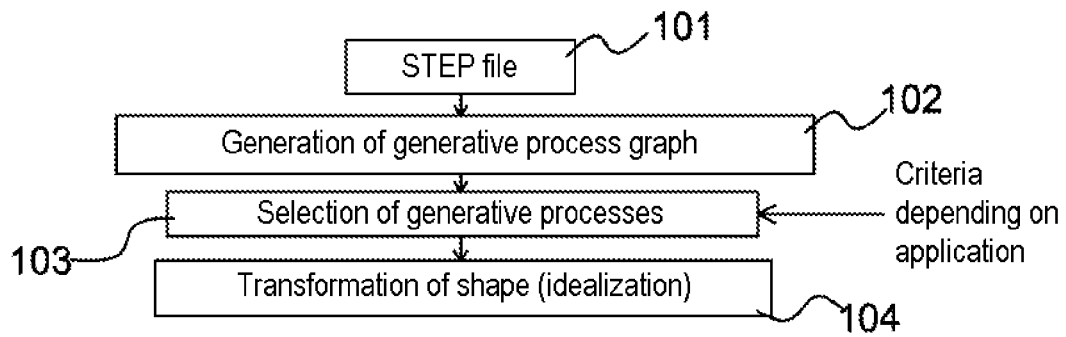
FIG. 1: a flowchart of the principal steps of a method as described.

In the following sections, reference will often be made to the concepts and notation described next.

The 3D object construction graph generation process is determined on the basis of various construction sequences of that object. The description of the invention refers to an analogy between the geometrical construction of an object and a process including the temporal marks of the construction operations. To designate a construction operation, reference is therefore made to a time t characterizing the latter within a sequence describing a generative process. The preceding operation will therefore be labeled (t−1). The object for which the construction graph is to be determined is denoted M. This object is the result of combining the primitives contained in the construction graph. With reference to the times t of a sequence, there is also denoted by $M_0$ the starting object M. There is denoted by $M_{-j}$ an evolution of the object M during a construction sequence the origin of which is the object $M_0$ and $M_{-j}$ is the object obtained at the time $t_j$ corresponding to the $j^{th}$ step of the sequence before reaching the object $M_0$. This notation indicates that including the step j there remain j construction steps before $M_{-j}$ reaches the shape of $M_0$ that coincides with the starting object M.

There is denoted by $\partial M_{-j}$ the set of connected faces defining the boundary of the object $M_{-j}$.

1.1 Modeling Hypotheses and Context

Given a target object M to be analyzed (for example by morphological analysis of M with a view to a finite element calculation), the object will first be considered independently of the modeling context indicated above. The object M will have been generated using CAD software or more generally a geometrical modeler and therefore obtained by means of a set of primitives combined with one another by addition or removal of material (regularized Boolean union or difference operations between primitives).

The combinations by Boolean operations between these primitives therefore create interactions between their boundary surfaces which in turn produce intersections of curves that form the boundary, that is to say the faces, the edges and the vertices, of a volume (B-Rep) modeling of the object M. In a B-Rep volume modeling as used in the present method, a volume is known by its boundary surface, on condition that this surface be closed, oriented and without intersection with itself Consequently, the boundary of the object M contains traces of the generative processes that produced its primitives. Accordingly, elements of the boundary of M, that is to say faces, edges and vertices, may be considered as the memory of the generation processes in which the primitives are sequentially combined by regularized Boolean operators.

Current CAD modelers are based on strictly sequential processes in which a primitive is combined with the intermediate object with the aid of a regularized Boolean operator, because it is difficult for the user to generate a plurality of primitives simultaneously without looking at the intermediate results, to see how they combine or interact, and at their influence on the shape of the intermediate object. As indicated in the preamble, a result of this behavior ism that the construction trees associated with objects are binary trees.

Therefore, the B-Rep volume modeling operators in the CAD modelers being only binary operators, during a design process, the operator chosen by the user combines the last primitive generated with the shape of the object M in the step t of that generative process.

Moreover, CAD modelers providing regularized Boolean operators (operators guaranteeing that the geometrical model resulting from the operation is a variety of the same dimension as the operands) reducing them to binary operators, they are then n-ary, as conventionally defined in CSG (Constructive Solid Geometry) volume modeling approaches.

In the present method, no restriction is applied to the quantity of primitives that may be generated 'in parallel', which is to say that the arity of the combination operators is n>2.

It is seen that the number of possible generative processes producing the object M may be arbitrarily large, for example, e.g. a cube can be obtained from an arbitrarily large number of extrusions of arbitrarily weak extent combined with a union operator.

The concept of maximum primitives is therefore used so that the number of primitives used to generate the object M is finite and as small as possible.

A valid primitive Pi identified in a step t of the process of construction of M using a base face Fb1 is referred to as a maximum primitive if no other primitive $P_j$, valid in the same step t, having F'b1 as the base face, cannot be entirely inserted into the primitive Pi (see section 2.1). This is reflected by the condition: $P_i \cap^* P_j \neq P_j$, where $\cap^*$ designates the regularized Boolean intersection operator (the definition of such an operator is known to the person skilled in the art).

The maximum primitives imply that the contour of a sketch may be arbitrarily complex, which is not the case in current engineering practice, where the use of simple primitives facilitates interactive modeling, parameter setting and assigning geometrical constraints to contours.

Even if the use of maximum primitives considerably reduces the number of possible generative processes, they are far from being unique for the object M In this particular implementation of the method, it is considered that the generative processes constituting the construction graph are additive, that is to say that they are exclusively based on a regularized union operator (the definition of such an operator is known to the person skilled in the art) at the time of the combination of the primitives in each step t of construction of the object using generative processes of M. In an application of the construction graph to idealization of 3D objects, the use of additive generative processes is preferred over material removal operations that cannot easily be used in idealization operations. If M has a shape such that, locally, decomposition cannot be obtained without recourse to a material removal operation, the decomposition process will produce a volume domain that will not be an extrusion primitive.

In order to reduce further the number of generative processes explicitly described in the construction graph, those generative processes must be non-trivial variants of processes already identified. For example, the same parallelepipedal block may be extruded with three face contours and orientations that are different but create the same volume. In the present method, these equivalent processes are detected by comparison of the geometrical properties of the contour of the object generated. More generally, trivial variants of generative processes are implicitly described by simple algorithms attached to each of the nodes of the construction graph. Apart from the previous example, there may also be mentioned the algorithm that enumerates all the possible combinations of regularized union binary operations between all the primitives Pi present at the same node in order to reduce a generative process to a binary tree.

Other similar observations will be touched on in subsequent sections to describe the criteria for selection of meaningful generative processes.

The above hypotheses aim to reduce the number of generative processes producing the same object M whilst containing primitives suited to the idealization transformations, independently of the design process initially adopted by the engineers and independently of the topological constraints common to all CAD modelers (see section 1.2).

The overall approach can be represented by the FIG. 1 process. In a first step 101, a STEP file is supplied as input. It contains the volume model of the object M, described in B-Rep form.

In a step 102, a set of generative processes is extracted that shapes sets of construction trees able to produce a graph (set of construction trees arriving at the same volume object).

To this end, in a step 103, criteria that depend on the application are used to identify one or more construction trees as a function of the requirements of the application.

In a step 104, in the case of finite element analysis, shape transformations are carried out (idealization).

1.2 Boundary Decomposition Intrinsic to a B-Rep Model Using Maximum Entities

In order to extract generative processes from the decomposition of a B-Rep volume model of the object M, it is important to have a decomposition of that object M that uniquely characterizes its boundary and therefore its shape.

A decomposition of a B-Rep volume model of an object is not unique, however, and therefore not suitable, as it is subject to two influences:

1—The process of construction of this object, whether it is carried out in a forward (progressive) manner during a design process or in a backward (regressive) manner as in the present method.

In actual fact, each operation involving a primitive divides/joins the faces and modifies their edges (edges) of this primitive and of the current object concerned. During the assembly of faces constituting the boundary of the result object, adjacent faces may be defined by identical surfaces. The decomposition of the boundary of the result object is therefore not unique.

However, CAD modelers may not merge the corresponding entities in all cases, thus producing a decomposition of the boundary surface (into non-maximum faces) that does not change the shape of the object. This conforms to the Euler-Poincaré theorem that establishes a relation between the topological invariant of a volume object and the decomposition of its boundary into faces, edges, vertices.

For the requirements of the present method, such configurations of faces and of edges must lead to a merging process such that the decomposition of the boundary surface of the object is unique for a given shape. It therefore becomes intrinsic to the shape of the object M.

2—The topological conditions necessary for establishing a coherent paving of the boundary of the object, that is to say the decomposition of its boundary surface, must be a CW complex (which is a type of topological space defined to meet the requirements of the theory of homotopy. A CW complex is a space constructed by sticking cells together. A 0-dimension CW complex is a finite set of points. A 1-dimension CW complex is a set of segments. A 2-dimension CW complex is a set of faces, etc.). Therefore, the closed curved surfaces must be partitioned.

For example, a cylinder is broken down into two half-cylinders in most CAD modelers or is described with an self-connected patch attached along a generatrix.

In both cases, the edge(s) connecting the cylindrical faces are adjacent the same cylindrical surface and are not meaningful from the point of view of the shape of the object incorporating that surface. Accordingly, for our purposes, this paving must not participate in the decomposition of the boundary surface of the object in order for that decomposition to be intrinsic to the shape of the object.

Given the above observations, there are introduced concepts of maximum faces and maximum edges as a means of producing an intrinsic and unique decomposition of the boundary surface of a given object M.

The maximum faces are identified first.

For each face of the object M, a maximum face F is obtained by repeatedly merging an adjacent Fa sharing a common edge with the face F when the Fa is defined by a surface of the same type and with the same parameters as F (typically adjacent plane faces that are defined on the basis of one and the same plane).

The face F is referred to as a maximum face when there is no longer a face Fa that can be merged with F (in intuitive terms, all the facets forming a face of an object have been encompassed). These maximum faces coincide with the "c-faces", defined in the prior art, that have been proved to define the object M uniquely.

Likewise, for each edge of the boundary of M, a maximum edge E having F1 and F2 as adjacent faces is obtained by repeated merging with an edge Ea, adjacent E, when Ea is also adjacent F1 and F2 (the maximum edge E is then the largest broken curve having F1 and F2 as adjacent faces).

Again, the edge E representing a portion of the boundary of a face F is referred to as a maximum edge if there is no longer any edge Ea that can be merged with E.

As a consequence of the successive merging processes, it is possible to end up with closed edges having no vertex or with closed faces having no edge.

Because of the possible existence of maximum edges without vertices and of maximum faces without edges, the merging operations are carried out only topologically, i.e. the B-Rep volume model representation of the object remains unchanged and its decomposition into maximum edges and faces constitutes a topological representation of its boundary interfaced with its B-Rep representation.

The maximum faces and edges are generated not only for the initial model M but also after the removal of each primitive during identification of the generative process graph.

The maximum primitives are based on the maximum faces and edges.

2. Generative Processes

Given an input volume object M, the first step of the method is to transform it into an object without blending radii. To this end, defeaturing functions (removing characteristic shapes) available in most CAD systems are used. Elimination of the blending radii concerns those that cannot be incorporated into primitives Pi.

Figure 2:
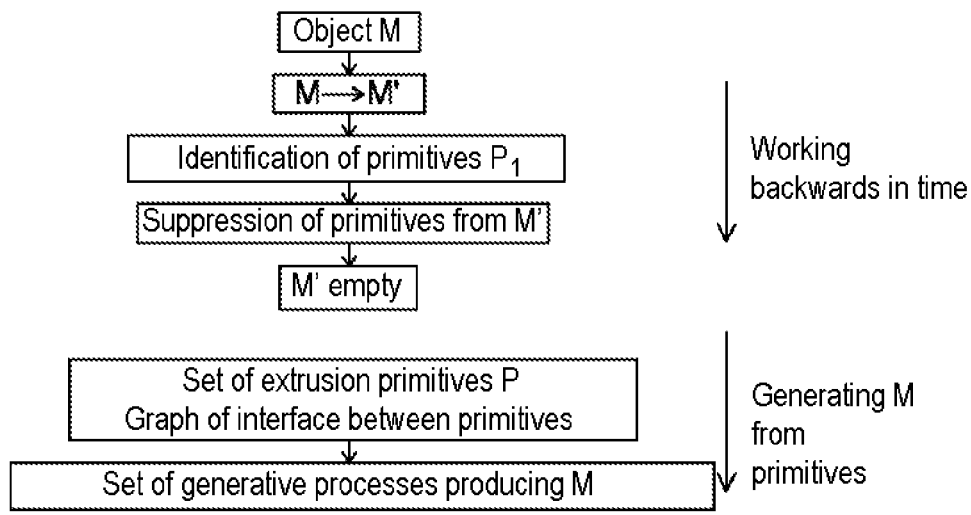
FIG. 2: a general schematic of the generation of generative processes corresponding to the generation of the construction graph of the initial object.

As seen in FIG. 2, starting from the object M, the generative processes are obtained in two phases:

1—the object M is processed by an iterative process to identify and to eliminate the primitives Pi. The objective of this phase is to "work back in time" until the root primitives of the generative processes are reached. The result of this phase is a set of primitives Pi.

2—Based on the hypotheses of section 3.1, a set of generative processes is produced using the primitives obtained at the end of the first phase to address the requirements of an application: here idealization before finite element analysis.

Figure 3:
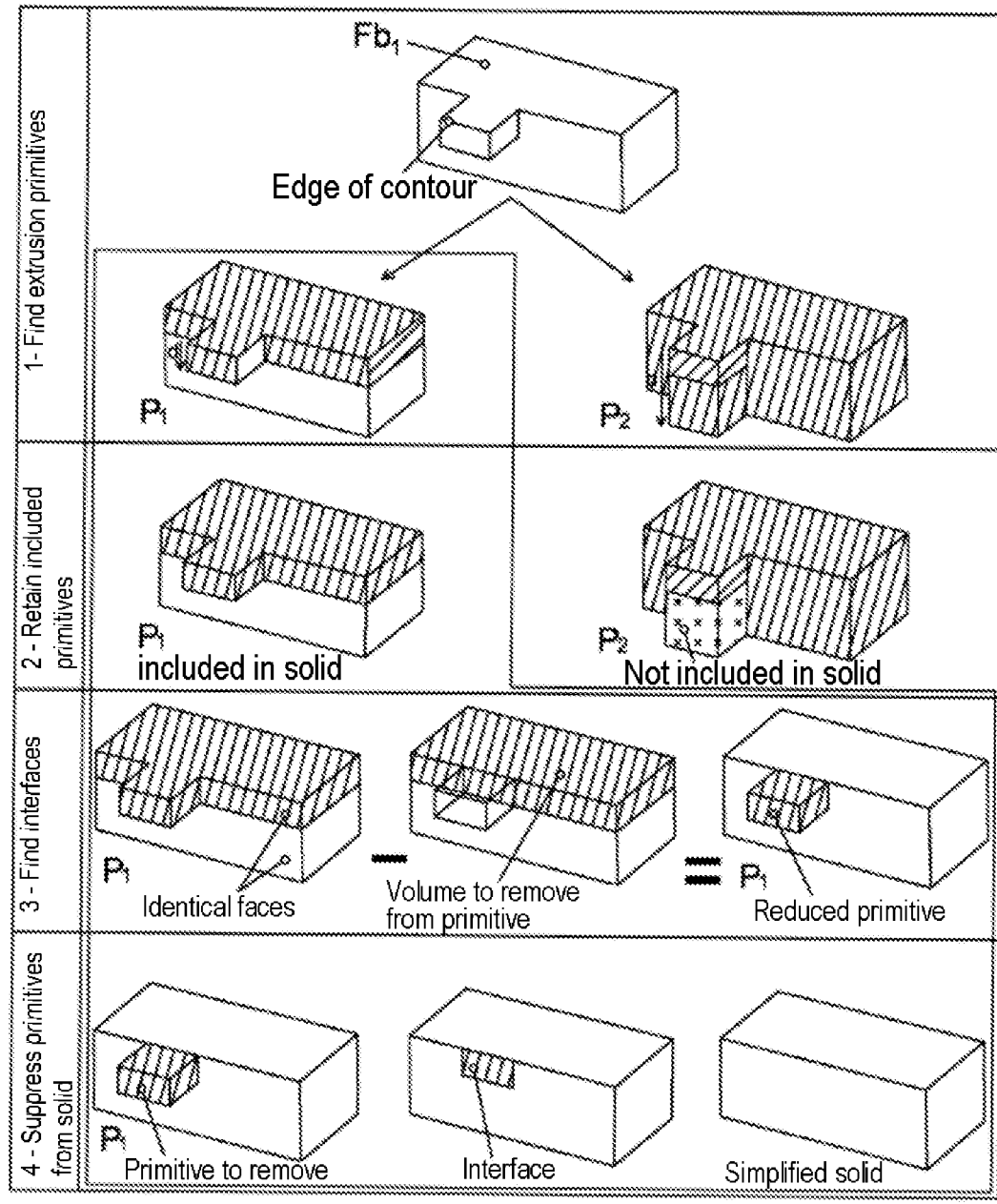
FIG. 3: the principal steps of the extraction of a primitive Pi in a generation step t of the generative process graph, that is to say from the identification of that primitive to its removal, in this step, from the intermediate object obtained from the initial object M.

2.1 Extrusion Primitives, their Visibility and their Attachment to the Object $M_{-j}$, an Evolution of the Object M Corresponding to the Step j of a Generative Process FIG. 3 shows the principal steps of the extraction of a primitive Pi from a generative process graph, that is to say based on the identification of that primitive up to its removal from M, and is explained in more detail below.

In order to identify the extrusion primitives Pi constituting the object $M=M_0$ and the evolutions $M_{-j}$ of that object, working back to the step j of the generation of the generative process graph, it is obligatory to define the geometrical parameters of the primitives Pi and the hypotheses adopted in the present method.

Firstly, a reference primitive Pi is never completely visible (there always exists at least one face of the primitive Pi that is not included in the boundary surface of $M_0$) in the object M or $M_{-j}$ unless the primitive Pi is isolated as a root of a construction sequence, that is to say Pi=M or Pi=$M_{-j}$. This situation expresses a branch termination in the construction graph associated with the object M. Apart from these particular cases, the reference primitives Pi are only partially visible.

For simplicity, such reference primitives Pi (those that are isolated as roots of a construction sequence) will be referred to as "visible primitives".

A primitive Pi is the memory of a generative process that has taken place between the object $M_{-j}$ and the object $M_{-(j+1)}$.

In the present method, the identification of the primitives based on visible extrusion contours makes it possible to generate reference primitives having simpler contours compared to primitives in which a portion of the contour would not be visible. In actual fact, in a step j in which the object $M_{-j}$ consisted of a primitive Pi and of the object $M_{-(j+1)}$, such that Pi would have a contour partially included in the object $M_{-(j+1)}$, that configuration gives rise to an infinity of trivial configurations that have no influence on the shape of the object $M_{-j}$ and for which the contour portions of the primitive Pi included in the object $M_{-(j+1)}$ could consist of an arbitrary number of geometrical elements (straight line segments, circular arcs) and thus of connection points between those entities. In one particular embodiment of the method, this entails minimizing the interface, that is to say the common part between the primitive Pi and the object $M_{-(j+1)}$.

The parameters operating in a reference extrusion primitive Pi are the two base faces Fb1 and Fb2, which are plane and include the same drawn contour on which the extrusion takes place.

Considering extrusions that add volume to a pre-existing object, the edges of the face Fbi are referred to as contour edges and the edges of that contour are referred to as convex.

A convex edge is such that the normals to its adjacent faces define an angle a such that: $0<\alpha<\pi$. When the primitive Pi belongs to the object $M_{-j}$, the edges of its contour along which the primitive Pi is fixed to the object $M_{-j}$ may be either convex or concave as a function of the proximity of the primitive Pi in the object $M_{-j}$.

In the extrusion direction d, all the edges generated from vertices of the contour are defined by straight line segments parallel to one another and orthogonal to the face Fbi. These edges are referred to as lateral edges of Pi. The faces adjacent the face Fbi are referred to as lateral faces. These lateral faces are delimited by four sides, two of them being lateral edges.

Lateral edges may be imaginary lateral edges when a lateral face coincides with a face of the object $M_{-j}$ adjacent the primitive Pi.

When the lateral faces of the primitive Pi coincide with faces adjacent the evolution $M_{-j}$ in the step j of the object M, there may be no edge separating the primitive Pi from the evolution $M_{-(j+1)}$ of stage (j+1) (older iteration stage) of the 3 0 object M because of the definition of the maximum faces. Such a configuration refers to imaginary edges of a base face.

Visibility. The visibility of the primitive Pi depends on its insertion in the object $M_{-j}$ and fixes the conditions for identifying the primitive Pi in $\partial M_{-j}$. The simplest visibility is obtained when the base faces Fbi of the primitive Pi in the object $M_{-j}$ exist and when at least one lateral edge connects Fbi to $M_{-j}$.

More generally, the primitive Pi is identified by two conditions.

Firstly, at least one base face Fbi is visible in the object $M_{-j}$, i.e. the primitive Pi can be identified by a plane maximum surface (face including all the facets adjacent that face and of the same type with the same parameters).

Secondly, there exists a lateral edge, namely a perpendicular straight line segment connected to a convex edge of Fbi. This edge defines the extrusion distance of the primitive Pi. Other lateral faces are identified by propagation from two sides of the candidate edge until the contour edges of Fbi are no longer convex.

More generally, but without this being limiting on the invention, the lateral edge need not be orthogonal and may be connected to a convex edge of Fbi. In this case, the primitive Pi identified will be inclined relative to the face Fbi in the direction defined by this edge.

Attachment. An extrusion primitive Pi is attached to the object $M_{-j}$, the evolution in the step j of the object M, according to its visibility in the object $M_{-j}$. The area of attachment between the primitive Pi and the object $M_{-(j+1)}$ corresponds to the faces and to the fragments of faces of the primitive Pi that do not exist in the object $M_{-j}$ and that are necessary to the definition of ∂Pi so that ∂Pi is a closed surface: necessary condition for Pi to be a volume primitive. The attachment defines a geometric interface IG between the primitive Pi and the object $M_{-(j+1)}$ that is the intersection of Pi and the object $M_{-(j+1)}$, the evolution in the step j+1 of the object M.

This geometric interface IG may be a surface and/or a volume, that is to say a non-variety model (object consisting of surfaces and volumes that is not a variety in the mathematical sense). One of the simplest attachments occurs when the extrusion primitive Pi has its base faces Fb1 and Fb2 visible with similar contours. This signifies that the primitive Pi is connected to the object $M_{-(j+1)}$ via lateral faces only.

Consequently, the geometric interface IG is a surface defined by all of the lateral faces that are not visible in the primitive Pi.

All possible geometric interface IG variants must be evaluated in order to retain those which are acceptable, that is to say those which define Pi such that Pi combined with the object $M_{-(j+1)}$ actually produces $M_{-j}$.

Initially, the method of extracting extrusion primitives Pi may be reflected in an algorithm enabling them to be found (procedure find_visible_extrusion of algorithm 1).

The extrusion primitives Pi are then subjected to validity conditions as described in the next section.

2.2 Suppression of Primitives by Working Back in Time

The objective now is to describe the suppression operator that produces a new object $M_{-(j+1)}$ (evolution in the step j+1 of the object M) preceding the object $M_{-j}$.

This suppression operator is defined as a binary operator with the extrusion primitive Pi and the object M−j as operands and the object $M_{-(j+1)}$ as result. In the context of a construction graph generation process, the object $M_{-j}$ relates to a step j and the object $M_{-(j+1)}$ to a step (j+1) earlier in the construction graph of the object M.

Interface characterization. In order to be in a position to generate the object $M_{-(j+1)}$ once an extrusion primitive Pi that is valid (see the definition of the validity constraint below) has been identified, it is necessary to reconstruct the faces adjacent the primitive Pi so that the object $M_{-(j+1)}$ defines a volume.

To this end, the faces of the object $M_{-j}$ adjacent the primitive Pi and the geometric interface IG must be characterized. It is considered here that at least one edge of the primitive Pi is adjacent other subsets of primitives. It is considered hereinafter that the base face used to identify Pi is Fb1. The suppression operator varies as a function of the type of geometric interface IG and two categories may be set up to simplify the description of this operation:

1—The geometric interface IG is of surface type. In this category, the suppression operator will have to create lateral faces and/or an extension of the base face Fb2 such that the extended face Fb2' coincides with the other base face Fb1. In fact, this category must be subdivided into two subcategories:

1a—The geometric interface IG contains only lateral faces of Pi or the geometric interface IG contains such lateral faces and also an extension of the base face Fb2 and the edges of that extension are concave edges of the object $M_{-(j+1)}$, 1b—The geometric interface IG contains lateral faces of the extrusion primitive Pi that also contains an extension of the base face Fb2 and the edges of that extension are imaginary edges of the base face in the object M−j These edges would be convex edges in the object $M_{-(j+1)}$ (example P1 in FIG. 3), 2—The geometric interface IG contains at least one volume subdomain.

Validity. Regardless of the IG category, once the extrusion primitive Pi has been found and its parameters have been fixed (contour, distance and extrusion direction), it is necessary to validate the primitive Pi before defining its geometric interface IG (step 2 in FIG. 3).

Pi denotes the volume of the reference primitive, that is to say the whole of the extrusion primitive Pi. In order to be sure that the primitive Pi is indeed a primitive of the object $M_{-j}$ of M, the necessary validity condition is formally expressed using regularized Boolean operators between these two volumes:

$$(M_{-j} \cup^* Pi) -^* M_{-j} = \emptyset \qquad (eq. 1)$$

This equation indicates that Pi intersects the object $M_{-j}$ only along looped edges forming its attachment to the object $M_{-(j+1)}$, that is to say that the primitive Pi does not cross the boundary of the object $M_{-j}$ at a location other than its attachment.

The regularized Boolean difference indicates that the boundary configurations producing common points, segments of curves or of surfaces between Pi and the object $M_{-j}$ at locations other than the attachment of the primitive Pi are acceptable.

This validity condition greatly reduces the number of primitives participating in the definition of the construction graph of the object M.

Suppression of the primitive Pi. The next step consists in generating the object $M_{-(j+1)}$ once the extrusion primitive (reference primitive) Pi has been found and suppressed from the object $M_{-j}$ of M. Depending on the type of geometric interface IG, certain faces of the reference primitive Pi may be added to be sure that the object $M_{-(j+1)}$ is indeed a volume. In all cases, at least one face of the reference primitive Pi must be modified so that the visible part of the primitive Pi describes the whole of ∂Pi, therefore defining the reference primitive Pi.

If the geometric interface IG is of type 1a, then the faces adjacent the contour edges of the base face Fb1 are orthogonal to Fb1 or all parallel to the extrusion direction of Pi. These faces are either plane or cylindrical. The geometric interface IG contains the faces Fa1 defining the lateral faces of Pi to shape the lateral faces of the extrusion primitive Pi that have been "entirely hidden" in the object $M_{-j}$. Fa1 designates a set of faces.

The edges of the attachment of the primitive Pi belonging to the lateral faces of Pi may be lateral edges (real or imaginary) or arbitrary edges. The lateral edges limit the lateral faces defined in the set Fa1; the arbitrary faces limit the extension of the partially visible lateral faces of Pi; they belong to the set Fa2.

The geometric interface IG may then contain an extension of Fb2 called Fa3 such that: Fb2 U Fa3=Fb1. The boundary of the object $M_{-(j+1)}$ is then defined by:

$$\partial M_{-(j+1)} = (\partial M_{-j} - \partial P_i) U(Fa1 \ U \ Fa2 \ U \ Fa3). \quad \text{(eq. 2)}$$

in which $\partial M_{-j}$ is the set of connected faces defining the boundary of the object $M_{-j}$, $\partial M_{-j}$ is the set of connected faces delimiting the visible part of Pi. The object $M_{-(j+1)}$ defines a closed, orientable surface with no self-intersection. The object $M_{-(j+1)}$ is therefore a volume.

If the geometric interface IG is of type 1b, IG contains a set of faces Fa1 extending the lateral faces of the visible part of the primitive Pi. To reduce the description of the various configurations, the emphasis will be on the essential aspect linked to the extension of the faces Fb2 contained in IG. If this extension can be defined as the above Fa3, it has to be observed that the imaginary edges of this extension in the object $M_{-j}$ are replaced by convex edges in the object $M_{-(j+1)}$, i.e. edges of the same (convex) type as the corresponding edges of Fb1.

Without going into details, because they add complexity of no utility to the shape of Pi and do not affect the complexity of the shape of the object $M_{-(j+1)}$, these imaginary edges can be suppressed to simplify the contour of the primitive Pi. This contour simplification may influence the content of the above sets Fa1 and Fa3, but has no impact on the integrity of the volume $M_{-(j+1)}$ obtained.

If the geometric interface IG is of type 2, it contains by definition at least one volume subdomain. Again, the diversity of the configurations may be relatively wide.

A first condition for generating a volume interface addresses the surface adjacent to Pi. If S is the extension of such a surface and if $S \cap *P_i \neq \emptyset$, then S can contribute to the creation of a volume subdomain.

After that, each of these surfaces S must be processed. To this end, all the edges attaching the primitive Pi in the object $M_{-(j+1)}$ and delimiting the same surface S in the object $M_{-(j+1)}$ are grouped together because they shape a subset of the contour of the faces that can contribute to a volume subdomain defining IG.

These groups are named Ea. The groups Ea, with other sets of edges, are used to identify loops in the surfaces S that define a volume subdomain of IG that must satisfy validity conditions not described here for conciseness.

There may be a plurality of valid volume subdomains defining variants of sets of faces that can replace the visible part of Pi, $\partial Pi$ in $\partial M_{-j}$ with series of faces that favor either the extension of the surfaces adjacent Pi or the imprint of Pi in the object $M_{-(j+1)}$ with the use of faces belonging to the hidden part of Pi in the object $M_{-j}$.

All the variants are processed to evaluate their contribution to the generative process graph. The contribution of a primitive Pi to the construction graph of M is described in section 3.

If, in a general context, there may be a plurality of variants of the geometric interface IG for defining the evolution $M_{-(j+1)}$ of the object M, those variants always produce a volume that can be realized, that is to say that the object $M_{-(j+1)}$ is necessarily bounded by a closed boundary surface, oriented and with no self-intersection, which are necessary conditions for the object $M_{-(j+1)}$ to be a volume. The existence of the object $M_{-(j+1)}$ defined as a volume makes it possible, in the iterative process of determination of the construction graph of M, to guarantee that the object $M_{-(j+1)}$ produced at the end of an iteration in which valid primitives Pi are suppressed from the current object $M_{-j}$, is a volume represented in B-Rep form, as the initial object M is.

3. Extraction of the Construction Graph of an Object M 3.1 Filtering of the Generative Processes After the primitive suppression operator has been defined, the object is now to integrate the constraints on the IG variants and therefore on the various valid and candidate primitives Pi to be integrated into the construction graph of the object M in order to be able to generate a meaningful set of objects $M_{-j}$, j>0 to produce a generative process graph.

As mentioned above, the aim is "to work back in time" from the object M to simple primitives that constitute the roots of the possible construction trees of the object M.

To this end, any acceptable suppression of candidate primitives Pi in the step j of the generation of the graph must produce a transformation of the object $M_{-j}$ into k objects $M_{-(j+1)k}$ each using the geometric interface $IG_k$, one of the geometric interface IG variants, such that the objects $M_{-(j+1)k}$ are simpler than the object $M_{-j}$.

This concept of simplicity is a necessary condition for the graph generation process to converge toward a set of construction trees having primitives as roots of the construction processes of the object M. Consequently, the concept of simplicity of shape applied to the transition between the object $M_{-j}$ and the object $M_{-(j+1)k}$ is sufficient to ensure the convergence of the process of generation of the construction graph.

The simplification of the shape occurring between the object $M_{-j}$ and $M_{-(j+1)k}$ may be defined as follows. Firstly, it has to be noted that the sets of connected faces delimiting the object $M_{-j}$ and $M_{-(j+1)k}$: that is to say $\partial M_{-j}$ and $\partial M_{-(j+1)k}$ contain maximum faces and edges.

In actual fact, after the reference primitive Pi has been suppressed and replaced (in the object) by the geometric interface $IG_k$ to produce the object $M_{-(j+1)k}$, the decomposition of its boundary is re-evaluated to contain only maximum faces and edges.

If $n_j$ denotes the number of maximum faces in $M_{-j}$ and $n_{(j+1)k}$ the same quantity in the object $M_{-(j+1)k}$, then the quantity $\partial jk$: $\partial jk = n_j - n_{(j+1)k}$ characterizes the simplification of the shape for the variant $IG_k$ of the interface IG, resulting from the visible primitive Pi, if $\partial jk > 0$.

This validity condition is justified because it imposes a reduction of the number of maximum faces of the successive models $M_{-(j+1)k}$ during each step j of generation of the construction graph. This condition relies on maximum faces that are entities intrinsic to each object $M_{-j}$. The process of generation of the construction graph is therefore intrinsic to the object M.

3.2 Generative Process Graph

After the condition has been defined for evolving in the reverse order of the possible construction processes of the object M in the generation process graph, the creation of that graph is summarized in algorithm 1:

Procedure: Extract graph
  inputM ;
    node list ← root; current node ← root;

```
            arc list ← nil; current arc ← nil; nb conf ig = 1;
            list conf ig(0) = M;
            while nb conf ig > 0 do
                for i = 0 to i = nb conf ig do
                    Mj = get conf ig(list conf ig(1));
                    list conf ignew = P rocess variant(Mj );
                end for
                nb conf ig = compare conf ig(list conf ig, list conf ignew);
            end while
        Procedure: list conf ig = P rocess variant(Mj );
            ext list = find extrusion(Mj );
            while size(ext list) > 0 do
                for i = 0 to i = size(ext list) do
                    P (i) = get P i f rom list(ext list);
                    P (i) = simplify prim contour(P (i), Mj );
                    interf list(i) = generate geom interf aces(P (i), Mj );
                    interf list(i) = discard complex(interf list(i), P (i), Mj );
                    if size (interf list(0) = 0 then
                        remove f rom list(P (i), ext list);
                    end if
                end for
                initialize primitive list(prim list);
                for i = 0 to i = size(ext list) do
                    append(prim list, interf list(i));
                end for
                sort primitive(prim list);
                nb conf ig = generate independent ext(prim list, Mj , );
                j = j - 1;
                for i = 0 to i = nb conf ig do
                    prim set = extract primitive set(i, prim list);
                    Mj = remove primitives(Mj+1, prim set);
                    node = generate node(Mj , prim set);
                    add node(node list, node);
                    arc = generate arc(node, current node);
                    add arc(arc, current arc);
                end for
            end while
            if size(ext list) = 0 then
                list conf ig = 0;
            end if
        Procedure: find extrusion(Mj )
            ext list = find visible extrusions(Mj );
            ext list = remove ext outside model(Mj , ext list);
            ext list = remove ext included ext(ext list);
```

In a step j of generation of this graph, the principal procedure extract_graph processes the possible variants of the object $M_{-(j+1)k}$ forming part of the list of nodes (node_list) by working through the processes of construction of M in reverse order using the procedure for processing variants (process_variant) and the new variants $M_{-(j+1)k}$ generated are compared to the nodes of the graph (here a node of the graph is a simplified model, that is to say an evolution toward the step j+1 of the object M) that exists already using the procedure compare_config.

If the variants $M_{-(j+1)k}$ are identical, the nodes of the graph are merged, which creates cycles in the graph (because two or more different successions of suppressions of primitives lead to the same variant of the object M in the step (j+1)).

After this, the extract graph procedure adds to the graph an arborescent structure with a given variant corresponding to the simpler new variants $M_{-(j+1)k}$ derived from $M_{-j}$.

The graph is completed when there is no longer any evolution variant of the project M to be processed, that is to say the list of nodes of the graph (node_list) is empty.

To produce a compact graph, it is obligatory, in each step j, to determine the greatest possible quantity of primitives Pi satisfying all the criteria described in the foregoing sections and to assign them to a node of the graph.

Accordingly, each of the nodes of the graph expresses the fact that all the primitives Pi at that node of the graph could be suppressed (when the graph is worked through "working backwards in time"), one by one, in an arbitrary order, which avoids having to describe variants of a trivial order as has already been mentioned if a binary construction tree of the object M must be extracted from the construction graph.

To process each variant $M_{-j}$ of the object M, the variant processing procedure (Process_variant) begins by identifying valid visible extrusion primitives in $M_{-j}$ using find_extrusion (see sections 2.1 and 2.2, respectively).

However, in order to produce maximum primitives, all the valid primitives that can be included in other primitives (because their contour or their extrusion distance is smaller than the others) are removed (remove_ext_included_ext) because they would produce trivial solutions.

Once valid maximum primitives have been found, the processing of the current variant $M_{-j}$ relates to contour simplification in a procedure simplify_prim_contour, if this does not impact on the shape complexity of the evolution $M_{-(j+1)}$ (see section 2.2), that is to say that the object (or evolution) $M_{-(j+1)}$ must always have a simpler shape than the object $M_{-j}$.

After this, all the valid geometric interfaces $IG_k$ of each primitive are generated using a procedure generate_geom_interfaces (see section 2.2) and the geometric interfaces IGk that increase the complexity of the shape of the object $M_{-(j+1)}$ are discarded using a procedure discard_complex to ensure the convergence of the algorithm generating the construction graph (see section 3.1).

Here the aim is to remove (using remove_primitives) the greatest possible quantity of reference extrusion primitives Pi the interfaces $IG_k$ of which do not overlap one another, as otherwise ∂jk would not be meaningful (simplification of the shape guaranteed by the variant $IG_k$). The removal criterion expresses the fact that any pair of different primitives (Pi, Pj) stemming from all the preceding processes must be such that the attachment of Pi in the object $M_{-j}$ must be geometrically separate from the attachment of $P_j$. This means that the edges of the boundary of the visible part of Pi in the object $M_{-j}$ and the edges of the boundary of the visible part of $P_j$ in the object $M_{-j}$ constitute separate sets.

The sets of independent primitives stemming from all the preceding processes can be assigned to the node $M_{-(j+1)}$ and are then sorted to facilitate navigation of the user in the graph.

3.3 Results of Extraction of the Generative Process Graph

The above algorithm has been applied to a set of components the shapes of which are compatible with extrusion processes to remain consistent with algorithm 1 even though these are industrial components. These tests make it possible to demonstrate the convergence of the algorithm. If the components are not compatible with the definitions of extrusion primitives or with material addition generative processes, the algorithm is nevertheless operative but the objects that cannot be decomposed will not be extrusion primitives as described in the foregoing sections.

The examples considered also demonstrate that the construction graph structure is effectively a structure necessary for describing non-trivial object construction variants. The shapes of the components processed in the examples demonstrate that recourse to unique material addition operations for the description of their construction processes is particularly well suited to the identification of parts of those objects that are well suited to idealization transformations. If the decomposition method described does not at present incorporate any material removal operation and cannot decompose entirely into primitives a very wide diversity of object shapes, it nevertheless demonstrates the fact that preferring material addition operations for the object construction process description is a particularly suitable criterion if the decomposition obtained is used for a morphological analysis intended to effect idealization before finite element calculations.

The graph structure obtained from some examples demonstrates that the aggregation of numerous extrusion primitives in parallel in a single node of the graph can be achieved and produces a compact representation of the construction graph.

These results also show the necessity of introducing a continuity constraint to improve the decomposition process vis a vis idealization transformations for finite element calculation type applications. This constraint may be formalized as follows: the configurations produced by a procedure generate_independe_ext must be such that each object variant $M_{-(j+1)k}$ generated from the object M−j musts contain a volume object described by a single connected component as is the case for the object M.

This continuity constraint expresses the fact that the object M is a continuous medium and that its design process also follows this concept at each stage of its geometric construction process.

Consequently, each of its transformation steps must also satisfy this continuity constraint to ensure that any simplified model, that is to say any node of the graph, may be used as a basis for idealization.

After this, it is up to the idealizations and to their hypotheses to lift any such constraint, for example, during the replacement of a primitive by conditions at the kinematic boundaries to express a rigid body type local behavior.

Relative to this continuity constraint, it must be observed that if this constraint is not taken into account in the current method, the construction graph expresses a greater diversity of object construction processes. This greater diversity can facilitate the implementation of modifications of the dimensions and the shape of the object because the diversity of the primitives and therefore of the dimensions that are associated with them is greater if the continuity constraint does not participate in the generation of the construction graph.

It may equally be observed that the object construction logs, as described by the construction graphs obtained, are easier for a user to understand than those actually used to model the object using CAD software. In the latter case, in fact, the process of construction of the object is described by a single tree, of binary type. During the construction of objects of complex shape necessitating numerous steps (several tens of steps or even more than around one hundred steps in the case of complex industrial objects), it becomes difficult for the user to determine the impact of their choice (primitive type and contour, material addition or removal operation) at a step j of a construction process on a later step separated from the step j by one or more tens of other elementary construction operations.

Obviously, the extrusion primitives representing material addition processes are a better response to the requirements of an idealization process and are also better suited to a process of modification of dimensions as described in detail in section 1.

It has been shown that this graph is a promising basis for obtaining a better understanding of the structure of the shape of an object and evaluating its pertinence for idealization.

4. Generation of Idealized Models from a Generative Process Graph

Here there is described how a generative process graph obtained with algorithm 1 may be used in shape idealization.

More generally, the starting point of the idealization method may be defined as follows:

a volume 3D object described by its boundary in accordance with a B-Rep formalization constitutes the entry model, denoted M, a construction graph is associated with the object M to describe its construction from a set of simple shape primitives. A primitive of this kind is denoted Pi. The graph conforms to the features as described up to section 3. This graph may be reduced to a binary tree such as can be generated by CAD software. This graph or this tree is denoted $G_c$. In all cases, the constraints associated with any graph or tree linked to the object M concern the fact that the operator associated with each node proceeds by adding material. Each primitive Pi present in $G_c$ associated with the object M may be described by an extrusion primitive.

During the construction of the object M from primitives Pi as described in $G_c$, each primitive Pi has at least one geometric interface IG with at least one other primitive present in the construction graph $G_c$. That geometric interface is described explicitly, in accordance with a B-Rep representation, i.e. the geometric interface IG is represented by faces, edges, vertices and the latter carry attributes that distinguish them from the other faces, edges and vertices constituting the boundary of Pi. In accordance with the foregoing sections, the geometric interface IG may constitute a geometric model of non-variety type. If the construction graph $G_c$ originates from CAD software, it is therefore considered that the primitives Pi explicitly contain the geometric interfaces IG described above.

The result of the idealization process is the object $M_j$, derived from the object M.

Idealization of an object consists in identifying parts of that object the morphology whereof addresses proportions making it possible to place them in predefined categories representative of mechanical behaviors. There is a limited number of these categories and they may be listed as follows:

beam (geometric subdomain of an object two dimensions of which are small compared to the third. These two dimensions define the section of the beam), plate, shell, membrane (geometric subdomain of an object one dimension of which is small compared to the other two. This dimension defines the thickness of the plate, shell or membrane), 3D solid (subdomain that does not have the benefit of the foregoing morphological properties and must be treated by a three-dimensional mechanical behavior).

From a geometrical point of view, the principle of the idealization method corresponds to a variety dimension reduction of the identified subdomains. For example, a convex volume subdomain (3-dimension variety), morphologically of beam type, will be idealized as a line (1-dimension variety). The line corresponding to the locus of the centers of inertia of the sections is located inside the initial volume subdomain. Thereafter, for the construction of the idealized module derived from M, geometric operations of connection between the idealized subdomains must be carried out. An advantage of the graph $G_c$ and of the geometric interfaces IG is that the geometric loci of the geometric interfaces IG on the primitives Pi make it possible to localize and to limit the connections between the idealized subdomains. This constitutes one of the major difficulties alleviated by the idealization method described below.

The following description refers to a dimension reduction or idealization operation to designate more simply a dimension reduction operation on a geometric variety of a subdomain (primitive Pi or part of that primitive).

An idealization process makes significant reference to the know-how of the user in order to respond to the objectives of a finite element analysis, for example. The proposed method enables intervention by the user in order to adapt certain idealizations and certain connections between idealized subdomains according to their know-how.

4.1 Idealization Method Structure

The method for idealization of an object M is founded on morphological analysis operations, idealization operations and operations of connection between idealized subdomains, in order to produce the idealized model of M, denoted $M_j$.

FIG. 4 shows the various steps of this method. In a first phase, the decomposition of the object M into primitives Pi as described in the graph $G_c$ leads to a first phase of morphological analysis of each of the primitives Pi. In the case of extrusion primitives, this morphological analysis makes it possible to determine if the primitive Pi has a plate, shell or membrane type morphology rather than a 3D solid type morphology. This step is described in section 4.2 and calls for intervention by the user to define thresholds in order to adjust the boundaries of the categories of morphologies.

The second morphological analysis again concerns all the primitives Pi and makes it possible to determine if the latter can be subdivided into subdomains, denoted $Dj_{(Pi)}$, morphologically different from that which was assigned to them during the first analysis. This analysis is conducted on the basis of the extrusion contour used for the definition of the primitive Pi. The decomposition obtained in this way of each primitive Pi into subdomains $Dj_{(Pi)}$ generates new interfaces IG. This analysis also calls on the user and their know-how to adjust the boundaries of the categories of morphologies and where necessary to intervene in the choice of interfaces between the subdomains $Dj_{(Pi)}$.

In a second phase, on the basis of a typology of the connections between the various idealization morphologies, an analysis of the interfaces IG between primitives Pi is used to propagate and to update the geometrical limits of each subdomain $Dj_{(Pi)}$. This phase corresponds to a process of reconstruction of the object M on the basis of the primitives Pi and the subdomain $Dj_{(Pi)}$ contained in each primitive Pi. This operation is equivalent to a regularized Boolean union operation: $M=\cup^*_i P_i=\cup^*_i\cup^*_j Dj_{(Pi)}$, representing a process of construction of the object M from the construction graph $G_c$. This step, described in section 4.3, leads to the decomposition of the object M into new subdomains the morphology of which has been categorized as being of beam, plate, membrane, shell or 3D solid type because this operation takes into account the influences of the interfaces IG between Pi and between $Dj_{(Pi)}$.

This can lead to primitives Pi split into two or more parts. The subdomains modified or created by this operation are collectively denoted: $D'k_{(Pi)}$. A new morphological analysis of each $D'k_{(Pi)}$ is therefore necessary to evaluate the resulting morphology evolutions by means of this union operation.

At this stage, it should be noted that the morphology of each $D'k_{(Pi)}$ combined with the typology of the connections between the various idealization morphologies makes it possible to identify subdomains that may be considered as details, independently of any finite element size concept.

In a third phase there takes place the generation of the idealization of each subdomain $D'k_{(Pi)}$ and, after that, the typology and the localization of the geometric interfaces IG are used to connect the idealized geometric models of the subdomains $D'k_{(Pi)}$ to one another and thus to derive an idealized model $M_i$ of the object M. During this operation, the interfaces IG between $D'k_{(Pi)}$ are used to limit the connections between $D'k_{(Pi)}$ and to obtain a robust connection process. In a subsequent operation, the typology of the connections between the various idealization morphologies is used to reposition certain mean lines or surfaces in order to simplify the object $M_j$. This step is described in section 4.4. During this step, the user can intervene to modify certain configurations as a function of their know-how.

Overall, the process described is therefore an automatic process that the user can interrupt for localized modification of a small number of configurations as a function of their know-how.

4.2 Evaluation of Primitives for Idealization

The primitives Pi extracted from the graph $G_c$ may be used to analyze their morphology and to evaluate their appropriateness for idealization. This first analysis determines if the primitive Pi has a morphology of plate, shell or membrane type rather than of 3D solid type.

Because the primitives are all extrusion primitives and associated with material addition operations, a first characteristic dimension of the primitive is determined by the extrusion length d. The morphological criterion used to determine if a primitive Pi, by default of 3D solid type, includes at least one geometric subdomain $Dj_{(Pi)}$ of plate, shell or membrane type is a ratio between the extrusion length and the maximum diameter max $\Phi$ of the circle inscribed in the sketched contour of Pi. The maximum diameter max $\Phi$ may be determined by applying an MAT (Medial Axis Transform) method by way of an algorithm corresponding to that method.

The morphological criterion is expressed by a ratio and may be formalized as follows: $x=\max((\max \Phi/d), (d/\max \Phi))$. The user then defines a reference threshold that $x_u$ must not pass for the primitive to be considered as of plate, membrane or shell type. This threshold is defined by default as $x_u=x_r=10$, corresponding, in terms of mechanics, to the reference morphology generally accepted in the formulation of the mechanical models of thin structures of plate, membrane, shell type. However, the user can reduce the value of this threshold, as a function of their know-how, in order to be more tolerant of the morphology of the idealizable primitives. Therefore, any value $x>x_r$ yields an idealized primitive automatically. If $x_u<x_r$ and $x_u<x<x_r$, the user has specified a threshold tolerating a greater number of idealizations and any Pi having a threshold in the range defined in this way is considered as idealizable. However, the user can intervene in a localized manner to modify the status of certain Pi using their know-how. For Pi such that $x<x_u$, its 3D solid status is not called into question.

It should be noted that $x=(\max \Phi/d)$ or $x=(d/\max \Phi)$ respectively indicates that the two independent dimensions present in the contour of the extrusion face are significantly larger than the thickness of the extrusion on the one hand and the extrusion direction is an idealization direction for Pi on the other hand. In all cases, these categories of configurations express a condition sufficient for applying a dimensional reduction to the primitive Pi. Pi therefore includes at least one subdomain $Dj_{(Pi)}$ morphologically of plate, shell or membrane type.

At this stage of the idealization process, the IG interfaces between the primitives Pi and the graph $G_c$ make it possible to define a graph of the interfaces between the primitives Pi denoted $G_i$. The content of $G_i$ will be explained in section 4.3.

Figure 5:
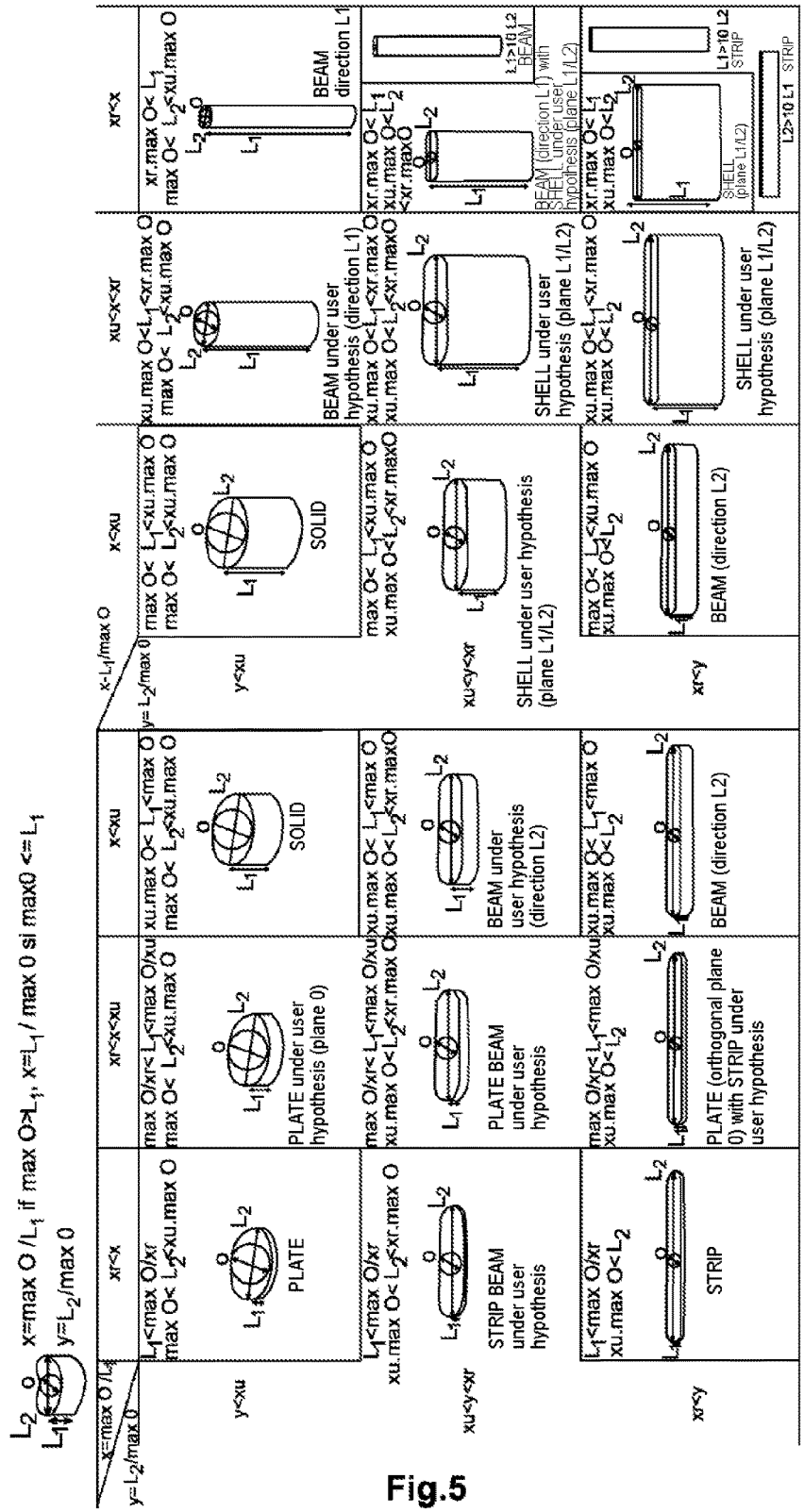
FIG. 5: a taxonomy of the morphologies associated with a segment of the MAT of a primitive Pi.

The second morphological analysis again concerns each Pi and its objective is to determine if parts of the primitive Pi, i.e. subdomains $Dj_{(Pi)}$, are morphologically analogous to beams, for example, and can therefore undergo further dimensional reduction. In actual fact, the ratio x characterizes only one morphological aspect of a subdomain of Pi because the locus of the MAT in which x is defined is not necessarily reduced to a point. FIG. 5 actually shows various configurations in which x is defined over a segment of the MAT of the extrusion contour of Pi. This figure is divided into two tables according to whether Pi can be idealized on the basis of its base face (left-hand table) or its extrusion direction (right-hand table). In the left-hand table, x characterizes the flattening of Pi. Consider for example the case: x<xu and y>xr. This configuration illustrates the fact that x is constant over this segment and that the length of this segment influences the morphology of Pi. Distinguishing this morphology relative to the flattening of Pi, characterized by x, necessitates the definition of a new parameter $y=L2/\max(\Phi)$. In FIG. 5, L2 represents an arc of the MAT of Pi belonging to the category 2 defined hereinafter. The parameter y is representative of the lengthening of Pi in the plane of its contour and makes it possible to distinguish primitives morphologically of beam type within the category of primitives morphologically of plate or shell type. In order to establish a link with the parameter x, the thresholds xu and xr are also used to specify lengthening morphology ranges. Accordingly, the thresholds xu, xr applied to the parameters x and y produce the nine configurations included in the left-hand table. The right-hand table is generated in accordance with the same principle, considering Pi to have a first lengthening in the extrusion direction and not a flattening as in the preceding table. These tables list the various possible morphologies taking into account the parameter xu fixed by the user.

FIG. 5 constitutes a taxonomy of the morphologies associated with a segment of the MAT of Pi. Given that the extrusion contour of Pi is constituted of straight line segments and circular arcs, the MAT includes rectilinear and curved segments. The MAT of Pi is structured in accordance with two categories of segments:

1. Segments of which one end point is situated on the extrusion contour of Pi and the other end point of which is connected to another segment of the MAT,
2. Segments of which both end points are connected to other segments of the MAT. In the particular case of segments having no end point (this is the case of a circular segment defined on the basis of a contour of Pi representing a circular ring), the MAT is reduced to a circle. This special case has no impact on the idealization method.

The segments of category 1 are suppressed and the morphological analysis bears on the segments of category 2 denoted $Sj_{(Pi)}$. On each of these segments, the ratio y has a maximum or is constant and $y_{max}$ represents the maximum of this ratio that is assigned to the corresponding segment. If Pi includes interior contours, the MAT obtained is reduced to segments of category 2 and includes cycles. In this case, a MAT, denoted MAT', is also determined using only the exterior contour of Pi. A comparative morphological analysis between the segments of MAT' corresponding to a cycle in MAT make it possible to process the configurations with interior contours and to analyze the corresponding flattening to distinguish perforated plates from hollow beams.

The segments $Sj_{(Pi)}$ are grouped into three subsets:
a. the segments $Sj_{(Pi)}$ forming an open chain including only one MAT bifurcation point at one of the ends of the sequence,
b. the segments $Sj_{(Pi)}$ forming an open chain including two MAT bifurcation points at each of the ends of this sequence,
c. the segments $Sj_{(Pi)}$ forming a closed chain including an arbitrary number of MAT bifurcation points and representing a minimum MAT cycle.

The morphology of each segment is affected in accordance with the taxonomy defined in the FIG. 5 tables. The division of Pi is then based on changes of classification determined automatically on each $Sj_{(Pi)}$ by the morphological analysis or by the modification effected by the user as a function of their know-how. The divisions are located on the transitions between two subsets from: 3D solid, (plate or shell), (beam or strip). This produces the subdomains $Dj_{(Pi)}$ of each primitive Pi that will be used in the subsequent idealization process.

During this morphological analysis, it is apparent that the classification of the various $Sj_{(Pi)}$ of the primitive Pi may lead to assigning a 3D solid status to a segment $Sj_{(Pi)}$ whereas Pi has an initial plate global status defined by x, for example. This configuration example does not contradict the idealization process but indicates that the MAT portion of the primitive Pi corresponding to $Sj_{(Pi)}$ potentially constitutes a detail within Pi because this MAT portion of the primitive Pi is significantly smaller than the primitive Pi. This detail concept corresponds to morphologies associated with segments $Sj_{(Pi)}$ having parameters (x, y) that constitute a taxonomy complementary to the morphology of the subdomains shown in FIG. 5. This taxonomy is not described here to preserve the conciseness of the description of the method but it should be noted that the detail concept appearing here is independent of any numerical method of solving the problem of analysis of structure generated on the basis of the model $M_i$. This constitutes a particularly novel point compared to the prior art.

After this morphological analysis, the subdomains $Dj_{(Pi)}$ are inserted as part of the primitive Pi with their morphological status, the localization of their geometric interfaces, in the graph $G_i$ of the interfaces between the primitives Pi described below.

4.3 Extension of the Morphological Analysis of the Subdomains to the Whole of the Object The morphological analysis of the primitives Pi, taken separately, is the first application of the construction graph $G_c$. The geometric interfaces IG between primitives Pi and the division of the Pi following their second morphological analysis step define a set of geometric interfaces IG represented in the graph $G_i$ of the interfaces between the primitives Pi. The nodes of the graph $G_i$ of the interfaces between the primitives Pi are subdomains $Dj_{(Pi)}$ and the arcs are interfaces IG.

Figure 6:
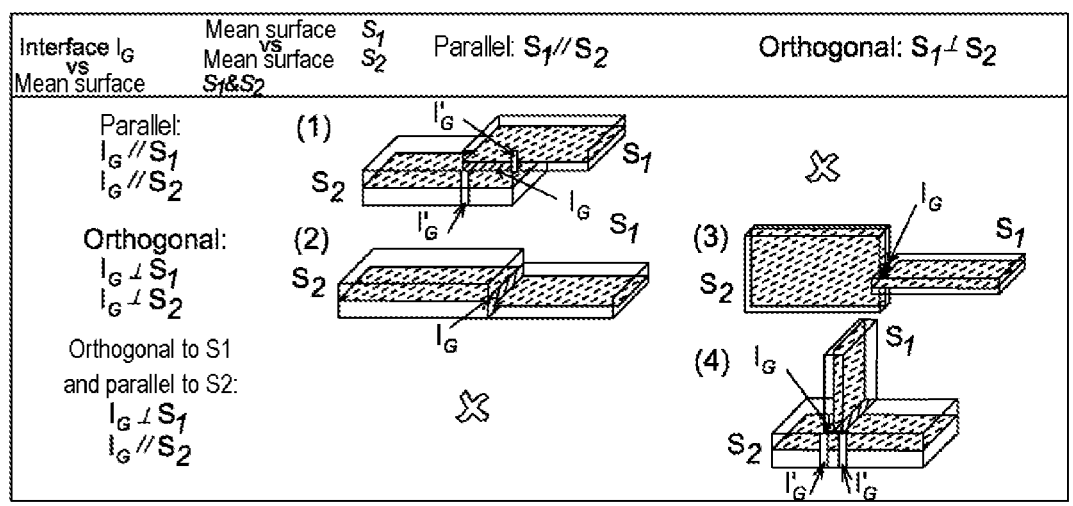
FIG. 6: some of the possible interfaces between subdomains $Dj_{(Pi)}$ when the latter are of plate or shell type.

FIG. 6 shows a portion of the possible interfaces between subdomains $Dj_{(Pi)}$ when the latter are of plate or shell type. This figure shows the codification of the connections between subdomains $Dj_{(Pi)}$ that is introduced into the graph $G_i$ of the interfaces between the primitives Pi.

In order to structure the connection information between subdomains $Dj_{(Pi)}$ the nodes of the graph $G_i$ are structured as follows:
the node is subdivided into three elements representing the structure of subdomains $Dj_{(Pi)}$, that is say an element representing the faces defining the thickness of $Dj_{(Pi)}$ and two other elements each representing a base face of $Dj_{(Pi)}$.

The graph $G_i$ of the interfaces between the primitives Pi then has properties making it possible to identify the structural role of groups of $Dj_{(Pi)}$. For example, a cycle formed by three subdomains $Dj_{(Pi)}$ interlinked by configuration connections (4) (see FIG. 6) such that one of these $Dj_{(Pi)}$: $Dk_{(Pi)}$ is linked to the other two by its faces defining its thickness that therefore bear on base faces of the other two subdomains, $Dp_{(Pi)}$ and $Dq_{(Pi)}$, and a connection of the same kind (base face of a subdomain connected to a face defining the thickness of the other subdomain) is established between the subdomains $Dp_{(Pi)}$ and $Dq_{(Pi)}$. This configuration corresponds to a structural role of subdomain $Dk_{(Pi)}$ stiffener type. On the basis of the taxonomy of connections between subdomains $Dj_{(Pi)}$ and as a function of the status of each subdomain (3D solid, plate/shell/membrane, beam), other roles can be identified such as stiffened plates, meshes.

Each subdomain $Dj_{(Pi)}$ has a status characterizing the dimensional reduction that may be applied to it (3D solid, plate/shell/membrane, beam) to which is added the detail status for characterizing subdomains $Dj_{(Pi)}$ that could be suppressed without significant impact on the finite element calculation results.

On the basis of this status, a taxonomy has been put in place that makes it possible to characterize the classes of possible connections between subdomains $Dj_{(Pi)}$. FIG. 6 gives a representation of this taxonomy for configurations of connections between subdomains of plate/shell/membrane type. Although this figure shows parallel and orthogonal configurations for simplicity, the latter can be extended to greater angular ranges to describe the classes of connections, which leads to encompassing IG of volume type and not only of surface type as indicated in FIG. 6. FIG. 6 shows all the valid configurations between two subdomains S1 and S2 for which a thickness parameter can be attached to each of them, which is compatible with extrusion type primitives Pi. The four valid configurations can be structured into two groups: (1) and (4) shape C1 and (2) and (3) shape C2. The configuration 1 of C1 is such that the thicknesses e1 and e2 of S1 and S2, respectively, are influenced by IG. That is to say that the area of overlap between S1 and S2 acts as a thickness increase that stiffens each of the subdomains over the extent of IG. This stiffness increase can be significant and necessitate its incorporation with the aid of a thickness variation to represent better the real behavior of the structure. This overlap area may be assigned to S1 or S2 or form an independent subdomain defined with thickness (e1+e2). Whichever solution is adopted, S1 and/or S2 is or are modified along with their interface IG, producing one or two new interfaces IG' (see FIG. 6). The interfaces IG' are necessarily of type (2) and intersect S1 and/or S2 as a function of the solution adopted.

In a similar manner, the configuration (4) is such that S2 can be stiffened by S1 as a function of the thickness of S1 and/or of the 2D shape of IG. In order to simplify the description, reference is made here to a 2D shape designating a surface interface. The influence of the shape is characterized for example by the difference between an IG bounded by a single closed contour and an IG bounded by a plurality of closed contours. This latter case is representative of S1 with a tube shape, and IG is then a ring the effect of which will be to stiffen the surface of IG on S2 that is bound by the exterior contour of the ring. In this case, the stiffness increase over an area of S2 can lead to partitioning of S2 into smaller subdomains and the effect of IG would consequently produce a configuration of type 2 with interfaces IG' when S2 is intersected by S1.

The configuration (1) reduces the areas of constant thickness of S1 and S2 (e1 and e2, respectively), which may influence the morphology of S1 and S2 in accordance with the criterion of idealization of primitives Pi defined in the previous section. The configuration (4) reduces the area of S2 of thickness e2 but has no influence on S1, which influences the morphology of S2 only. It may therefore be observed that processing configurations belonging to C1 produces configurations belonging to C2 only. Considering now the configurations of C2, none of them produces any stiffness increase comparable to C1 and necessitating a new subdivision of S1 or S2. Consequently, the configurations of C2 do not necessitate further processing and no configuration modification effected in C1 produces any new configuration in C1. This indicates that the processing of configurations in C1 involving subdivisions of subdomains are conservative in relation to C2. The procedure processing the configurations C1 therefore converges toward configurations C2 only. These observations and this property make it possible to put in place an iterative algorithm-based approach that necessarily converges.

More generally, the geometric interface IG may be of volume type between two subdomains $Dj_{(Pi)}$. This generalization is equivalent to considering configurations for which the conditions of parallelism and perpendicularity between S1 and S2 are replaced by configurations in which the angles between S1 and S2 depart from these reference configurations. Such configurations lead to the reference configurations of C1 and C2 in the following manner.

Firstly, it should be observed that the definition of the primitives Pi (see the concept of visibility of a primitive in the generation of $G_c$) guarantees that any primitive with a volume IG interface always has a base face visible, and its IG can therefore contain only one base face of the primitive Pi. In the FIG. 6 2D representations, the contours of S1 and S2 include the projections of the base faces Fb1 and Fb2 of each extrusion primitive defining S1 and S2. In these representations, what distinguishes C1 from C2 is characterized by the fact that the configurations (1) and (4) each contain S2 such that one of its base faces does not intersect S1. In the present case, it is considered that the base faces of S1 and S2 contain the extrusion contour of the corresponding primitives. Moreover, it is also seen that to distinguish configuration (1) from configuration (4) a base face of S1 does not admit any intersection with S2 for characterizing configuration (1) relative to configuration (4). It may be observed that configuration (4) involves entirely lateral faces of S1 whereas configuration (1) cannot involve entirely lateral faces of S1 and/or S2.

In configuration (2) of C2, lateral faces of S1 participate entirely in IG whereas the lateral faces of S2 participate therein only partially. This makes it possible to distinguish this configuration relative to configuration (3) in which lateral faces of S1 and/or S2 participate, in part, in IG.

This description shows that the proposed taxonomy of configurations extends to any relative positions of S1 and S2.

For conciseness, the description of the taxonomies of configurations of connections between (plates and beams, beams and beams, 3D solid and plates, 3D solid and beams) is not touched on. However, they are processed using similar principles. The taxonomy of connections of 3D solid type with 3D solid type are of no interest because those connections do not involve idealization transformations.

Starting from the taxonomy of the connections described and analyzed above, the next process consists in taking into account the effects of stiffening linked to certain connections to establish the connections between subdomains $Dj_{(Pi)}$ possibly leading to subdivisions of those subdomains producing the subdomains $D'k_{(Pi)}$ and updating the morphology of the $D'k_{(Pi)}$ in order to determine the nature of the idealization that may be applied to each of them. The morphological analysis obtained in this way can be evaluated graphically by the user in order to apply certain changes as a function of their know-how.

This process can be synthesized by the following algorithm (see algorithm 2). This algorithm is suited to the configurations processing only connections shown in FIG. 6, to simplify the description. Taking into account all of the taxonomy of the connections is based on principles similar to those of algorithm 2. The principle of this algorithm is to classify each IG between two subdomains $Dj_{(Pi)}$ such that if IG belongs to C1 (configurations (1) and (4) in algorithm 2), it must be transformed to produce new geometric interfaces IG' (see FIG. 5 in which interfaces IG' are indicated for configurations (1) and (4)) and the new subdomains $D'k_{(Pi)}$ that must be morphologically analyzed (Propagate morphology analysis procedure). According to the connection configuration between two subdomains $Dj_{(Pi)}$ one or both are divided along the IG contour to produce $D'k_{(Pi)}$. After this, the MAT transformation is applied to each of the subdomains $D'k_{(Pi)}$ in order to put into place a new morphological analysis and to determine the morphological parameters (MA morphology analysis procedure) that reflect the operations of union between $D'k_{(Pi)}$ that make it possible to generate the model M. That is to say that the generation of the model M from the $Dj_{(Pi)}$, i.e. $M = \cup^*_i P_i = \cup^*_i \cup^*_j Dj_{(Pi)}$, is replaced by: $M = \cup^*_i P_i = \cup^*_i \cup^*_j D'k_{(Pi)}$ which takes account of the result of the second stage of the morphological analysis of the Pi. The algorithm terminates when all the configurations of C1 have been processed.

```
Procedure Propagate morphologyanalysis(G_c, x_u)
    for each P in list primitives(G_c) do
        if P.x > x_u then
            for each IG in list interfaces prim(P ) do
                P_ngh = Get connectedprimitive(P, IG)
                if IG.config = 1 or IG.config = 4 then
                    interVol = Get interfaceVol(P, P_ngh, IG)
                    Pr = Remove interfaceVol from prim(P, interVol)
                    for i = 1 to Card(Pr) do
                        P' = Extract partition(i, Pr)
                        P'.x = MA morphology analysis(P')
                        P_ngh.x = MA morphology analysis(P_ngh)
                        if IG. config = 1 then
                            if P_ngh.x > x_u then
                                P r_ngh = Remove interVol from prim(P_ngh, interVol)
                                interVol.x = MA morphology analysis(interVol)
                                for j = 1 to Card(P r_ngh) do
                                    P'_ngh = Extract partition(j, P_r_ngh)
                                    P'ngh.x = MA morphology analysis(P'_ngh)
                                    if interVol.x < x_u then
                                        Merge(P, P_ngh, interVol)
                                    else
                                        P = P'
                                        Merge (P_ngh, interVol)
                                        Remove primitive (P_ngh, list primitives(G_C)
                            if P'.x < x_u then
                                Merge(P_ngh, P')
Procedure MA morphology analysis(Pi)
    for each Dj in list subdomain(Pi) do
        Cont = Get Contour(Dj)
        listofpts = Discretize contour(Cont)
        vor = Voronoi(listofpts)
        maxR = Get max radius of inscribed Circles(vor)
        x(j) = Set primitive idealizableType(maxR, Dj)
    return x
```

Among the features of this algorithm, it has to be observed that the influence of the neighbor primitive $P_{ngh}$ of Pi is taken into account when updating Pi, which becomes Pr. Here, each primitive Pi, $P_{ngh}$ designates a collection of subdomains $Dj_{(Pi)}$ resulting from the preliminary morphological analysis of each of them. In fact, Pr can therefore contain a plurality of volume subdomains, if Card(Pr)>1, as a function of the shape of Pi and of $P_{ngh}$. Each partition P' of Pr can have a morphology different from that of Pi, which constitutes a more precise indication of idealization for the user.

In the case of configuration (1), the area of overlap between $P_{ngh}$ and Pi must also be analyzed, likewise its influence on $P_{ngh}$ that becomes $Pr_{ngh}$. In this case also, $Pr_{ngh}$ can have a plurality of partitions, i.e. Card($Pr_{ngh}$)≥1, and the morphology of each partition $P'_{ngh}$, corresponding to a collection of subdomains $Dj_{(Pi)}$, must also be analyzed. If the common volume between $P'_{ngh}$ and P' cannot be idealized, it is merged with the more rigid of the two subdomains $P_{ngh}$ or Pi in order to preserve the morphology of the subdomain most appropriate for idealization. If a partition P' of Pr cannot be idealized in configuration (4), that partition can be merged with $P_{ngh}$ if the latter has a morphology of identical status (of plate/shell/membrane type, for example). The processes of dividing the primitives as a function of their interfaces IG therefore produce modifications of the subdomains $Dj_{(Pi)}$ to generate the subdomains $D'k_{(Pi)}$.

This process has been applied to various test components and it has been possible to see that each subdomain $Dj_{(Pi)}$ is strictly bounded by an interface IG of category C2 or by an interface IG' produced by the preceding algorithm. Accordingly, the method produces precise information on areas that can be idealized and the nature of the possible idealizations in those areas constituting the model M. Areas of M corresponding to primitives connected according to type (1) to one or two of the opposite base faces of primitives are subdivided into new subdomains that provide more precise information. However, in stacks of type 1 configurations including more than three stacked subdomains, new morphological configurations may emerge that have to be studied in order to define the corresponding idealization conditions.

With the construction graph $G_c$, the process of propagation of the morphological analysis is applied to the various construction variants of the object M. This enables the user to arrive at a compromise between the subdomains that can be idealized and a particular process of construction of the object M in order to be able best to adapt the idealized model $M_i$ as a function of the simulation objectives associated with the object M.

4.4 Processing of Connections Between Idealized Primitives

The final phase of the idealization process consists in generating the idealized models of each subdomain $D'k_{(Pi)}$ and connecting them according to the typology and the location associated with each of the interfaces IG between subdomains.

After the morphological analysis described in sections 4.2 and 4.3, the initial volume of the object M is segmented into volume subdomains $D'k_{(Pi)}$ for which the volume shape is a response to an idealization category of 3D solid, plate, shell, membrane and beam type.

Initially the idealized geometry of each subdomain is generated on the basis of the initial volume geometry of the subdomain. According to the idealization category of the subdomain, the geometrical support generated will be:

a plane mean surface in the case of subdomain $D'k_{(Pi)}$ identified as plate (see FIG. 5 taxonomy). This surface corresponds to the sketch surface of the subdomain offset by the half-thickness in the extrusion direction, a mean surface in the case of subdomain identified as shell (see FIG. 5 taxonomy). This mean surface is generated from the extrusion of the median line of the 2D sketch of the subdomain $D'k_{(Pi)}$ in the extrusion direction of $D'k_{(Pi)}$. The thickness of a shell is a function of the diameter of the circle inscribed in the sketch, in accordance with the MAT associated with the corresponding primitive Pi, a median line in the case of subdomain $D'k_{(Pi)}$ identified as beam. This line is generated on the basis of the sketch contour barycentre of $D'k_{(Pi)}$ if the direction of the beam corresponds to the extrusion direction. If the direction of the beam is orthogonal to the extrusion direction, the line corresponds to the median line of the sketch contour offset by the extrusion half-distance, the volume support of the corresponding subdomain $D'k_{(Pi)}$ in the 3D solid case.

In a second step, the graph of the interfaces IG is enriched with information on the geometric contours of the interface on the subdomains; these contours are denoted $Ci_{(D'k)}$. The geometrical region of the contour makes it possible to define if its boundaries belong to the base faces Fb1 and Fb2 of the subdomain $D'k_{(Pi)}$ or to one of its lateral faces. This information is derived from the content of the graph $G_i$ of the interfaces between the subdomains $D'k_{(Pi)}$ of the primitives Pi, which makes it possible to distinguish the base faces and the faces defining the thickness of a subdomain $D'k_{(Pi)}$. If a contour belongs to more than one lateral face or to a base face and one or more lateral faces, the contour is further divided into subcontours denoted $C'l_{(D'k)}$.

The next step consists in determining the pairs of contours belonging to the same subdomain and having a part of their contours in common, in other words the Boolean intersection of which is non-zero:

$$C'l_{(D'k)} \cap C'm_{(D'k)} \neq \emptyset.$$

The vicinity relations between contours of the same subdomain $D'k_{(Pi)}$ form a graph structure in which the nodes are the contours and the arcs the vicinity relations. This vicinity graph denoted $G_{D'k}$ can be interleaved into the graph of the interfaces $G_i$ in the node of the subdomain $D'k_{(Pi)}$.

With the aid of the structure of the graph $G_i$ including the graphs $G_{D'k}$ for each of the subdomains $D'k_{(Pi)}$, algorithms can be applied in order to determine particular properties of the graph responding to connection rules, between idealized supports, defined on the basis of the standard practice of preparation of idealized models from B-Rep volume models. The corresponding algorithms are applied automatically but the user can locally modify the results proposed by the algorithms.

For example, in the case of connections between subdomains of plate type, three algorithms are used to process:

configurations of groups of parallel plates. These groups of subdomains $D'k_{(Pi)}$ combine the mean plane surfaces that may be aligned in the same plane and therefore not necessitate additional connection surfaces between them. This surface offsetting is a rule coming from the user and integrated into the finite element calculation software. This rule authorizes the offsetting of the mean surface by a distance taken directly into account when introducing the finite element calculation by an appropriate formulation of the finite elements used. Accordingly, any path of the graph $G_i$ of the interfaces between the primitives $P_i$ passing only through arcs corresponding to interfaces of type (2) is a group of parallel plane surfaces, configurations of edge subdomains when the interface contour of type (4) of the subdomain $D'k_{(Pi)}$ parallel to the interface is situated at the boundary of its base face. A direct connection of the mean surface of $D'j_{(Pi)}$, orthogonal to the interface, situated by default in the middle of the subdomain $D'j_{(Pi)}$ leads to an area of small size (including the half-thickness of $D'j_{(Pi)}$ between the boundary of $D'k_{(Pi)}$ and the mean surface connection surface). This type of geometry is problematic during finite element modeling because it leads to the generation of meshes of small size and of low quality. It is then preferable to reposition the mean surface of $D'j_{(Pi)}$ at the edge of the mean surface of $D'k_{(Pi)}$, thereby avoiding any narrow area. This configuration, described for simplicity with an orthogonal position of $D'j_{(Pi)}$ relative to $D'k_{(Pi)}$ is generalized to any angular positions as described in the previous section, Configurations of cycles of connections between subdomains. If at least three interface contours of type (4) belonging to three distinct subdomains have a portion of their boundaries in common, the connections of the mean surfaces perpendicular to the interfaces toward the mean surfaces parallel to the interfaces must also be extended according to the extrusion directions of the adjoining interfaces in the cycle. This of configuration can be identified from the graph $G_i$ and the interleaved graphs $G_{D'k}$ as being cycles containing only arcs of $G_i$ associated with interfaces of type (4) and nodes of $G_i$; the interleaved graph $G_{D'k}$ therefore contains a path between the contours of the interfaces. These paths correspond to interface contours sharing a common boundary.

The list of particular configurations given above is not exhaustive but reflects the use made of the process of decomposition of M and therefore of the construction graph $G_c$, of the morphological analysis of M and of the graph of interfaces $G_i$. Other particular configurations such as the presence of stiffeners connected to opposite faces of subdomains $D'k_{(Pi)}$ may also necessitate operations of repositioning the mean surface of the stiffeners if they are too close to one another in $D'k_{(Pi)}$.

Once the foregoing particular configurations have been identified by the foregoing algorithms, the last step consists in connecting the idealized supports of the subdomains of beam, shell, plate types to their respective adjoining subdomains. The connections between mean surfaces are effected by a mean surface extension operator. As the precise locations of the interfaces between the subdomains $D'k_{(Pi)}$ to be connected are known accurately by their contours $Ci_{(D'k)}$, the connection surfaces are therefore bounded by connection areas defined by the contours added to the mean surfaces. This restriction makes the connection operator robust by avoiding it creating any surface outside the connection area, which distinguishes the process described from the prior art. The application of the connection operators therefore makes it possible to generate an idealized model $M_i$ derived from the initial model M.

If morphological analysis of the primitive Pi is one of the applications of the generative process graph, the decomposition primitive obtained may be used to monitor the idealizations. To this end, a taxonomy of the links between the extrusion primitives is shown in part in FIG. 6.

After the object M has been decomposed into extrusion primitives Pi, the location of the geometric interfaces IG between the primitives Pi are precisely identified and can be used to monitor the necessary offsets of the mean surfaces to improve the idealization process and to take account of the know-how of the user.

In particular, the connections with parallel mean surfaces may be processed with mean surface repositioning and a corresponding adjustment of the thickness of the material on both sides of the idealized surface, as described above in the particular processing of connections. This is a routine practice in the linear analysis of the mechanical engineering of structures that has advantageously be implemented using the relative position of the extrusions.

Advantages of the Method

The construction trees and the shape generation processes are common approaches to modeling mechanical components.

Here it has been demonstrated that construction trees, structured in a compact graph shape, can be extracted from the B-Rep volume model of a component.

The proposed method includes criteria making it possible to generate simple shape primitives and guaranteeing that the intermediate objects have their shape simplified after each primitive suppression. These properties guarantee the convergence of the algorithm used to generate the construction graph. In actual fact, the generation of the shape of a complex object from simple shape primitives presupposes a process capable of modifying a simple initial shape incrementally to obtain an arbitrarily complicated shape.

It has been shown that the construction trees are structured as a graph to represent a non-trivial set of generative processes that produce the input B-Rep volume model.

The graph contains non-trivial construction trees because the extrusion direction variants producing the same primitive are not coded, the material addition operations that may be conducted in parallel are grouped at a single node of the graph (only one evolution variant of the object) to avoid the description of combinatory combinations when the primitives are added sequentially as in CAD software. More generally, each node of the graph may be associated with simple algorithms for generating the trivial construction variants of an object.

The advantage of a generative process graph has been evaluated in the context of idealizations necessary for a finite element analysis. The simple shape primitives constituting the graph are particularly suited to a precise morphological analysis that makes it possible to characterize plates/shells/membranes relative to beams/strips and relative to 3D solids. This morphological analysis also makes it possible to characterize shape details relative to the local and idealizable morphologies of M, independently of any numerical structural calculation method.

Moreover, the decomposition of the object produces a precise description of the geometric interfaces between primitives, which have advantageously been used to implement idealizations.

The invention claimed is:

1. A method for a computer-assisted design of a second three-dimensional object on the basis of a first three-dimensional object known only by its boundary surfaces, via a B-Rep type volume model, of a plane, cylinder, cone, sphere, or toroid type, to the exclusion of free shapes in a definition of a boundary of the first three-dimensional object, the method comprising the steps of:
    decomposing the first three-dimensional object into a set of volume primitives, the first dimensional object being a structure of a system;
    associating with the first three-dimensional object a construction graph defined on a basis of the volume primitives and a set of geometrical parameters for using the volume primitives in a specific case of the first three-dimensional object; and
    generating the second three-dimensional object as a variant of the first three-dimensional object in accordance with the construction graph by modifying some of the geometrical parameters in response to a modification of the system resulting in a dimensional modification of the structure of the system.

2. The method as claimed in claim 1, wherein the construction graph includes all construction variants of the first three-dimensional object through Boolean combinations of the volume primitives.

3. The method as claimed in claim 1, wherein the construction graph includes at each node a greatest possible number of the volume primitives that can be applied at each step, which allows compact encoding of a number of construction possibilities of the first three-dimensional object.

4. The method as claimed in claim 1, wherein the construction graph is extracted with an aid of a primitive suppression operator that progressively simplifies a shape of the first three-dimensional object.

5. The method as claimed in claim 1, wherein the volume primitives comprise extrusion primitives defined by two parallel faces including an extrusion direction that is not parallel to the two parallel faces and an extrusion contour.

6. The method as claimed in claim 5, wherein the extrusion primitives are associated with each node of the construction graph with a union type Boolean operator, which corresponds to an operation of addition of material.

7. The method as claimed in claim 1, wherein the volume primitives comprise extrusion primitives; and further comprising the step of removing connecting radii of the first three-dimensional object that cannot be integrated into contours of the extrusion primitives.

8. The method as claimed in claim 1, further comprising a step of identifying maximum primitives in each step of decomposition of the first three-dimensional object, a primitive identified at a step t of a construction process of the first three-dimensional object being referred to as a maximum primitive if no other primitive valid at the same step t can be entirely inserted into the primitive identified at the step t.

9. The method as claimed in claim 1, wherein the system is an aircraft.

* * * * *